US008063454B2

(12) United States Patent
Sandhu et al.

(10) Patent No.: US 8,063,454 B2

(45) Date of Patent: Nov. 22, 2011

(54) SEMICONDUCTOR STRUCTURES INCLUDING A MOVABLE SWITCHING ELEMENT AND SYSTEMS INCLUDING SAME

(75) Inventors: Gurtej S. Sandhu, Boise, ID (US); Chandra V. Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 12/190,985

(22) Filed: Aug. 13, 2008

(65) Prior Publication Data

US 2010/0038730 A1 Feb. 18, 2010

(51) Int. Cl.
*H01L 27/14* (2006.01)

(52) U.S. Cl. ......... 257/414; 257/209; 257/415; 257/798

(58) Field of Classification Search .................. 257/209, 257/414, 415, 798, E29.001, E29.324
See application file for complete search history.

(56) References Cited

U.S. PATENT DOCUMENTS 6,835,613 B2 12/2004 Schlaf
7,330,369 B2 2/2008 Tran
7,336,523 B2 2/2008 Kang
7,558,103 B2 * 7/2009 Nakamura et al. ............ 365/151
2003/0122640 A1 7/2003 Deligianni et al.
2003/0178617 A1 9/2003 Appenzeller et al.
2004/0028812 A1 2/2004 Wessels et al.
2004/0188721 A1 9/2004 Lieber et al.
2005/0112791 A1 5/2005 Davis et al.
2005/0180193 A1 8/2005 Kang
2005/0215049 A1 9/2005 Horibe et al.
2005/0270442 A1 12/2005 Yang et al.
2006/0086314 A1 4/2006 Zhang et al.
2006/0260674 A1 * 11/2006 Tran .............................. 136/252
2006/0273871 A1 12/2006 Busta et al.
2006/0278902 A1 * 12/2006 Sun et al. ....................... 257/288
2007/0211525 A1 * 9/2007 Nakamura et al. ............ 365/164
2009/0174014 A1 * 7/2009 Kunze et al. .................. 257/415

FOREIGN PATENT DOCUMENTS

WO 2006137926 12/2006
WO 2007/131796 A2 * 11/2007
WO 2007146769 12/2007

OTHER PUBLICATIONS

Younan Xia et al., "One-Dimensional Nanostructures: Synthesis, Characterization, and Applications," Advanced Materials, Mar. 4, 2003, pp. 353-389, vol. 15, No. 5.
Dequesnes et al., Simulation of Carbon Nanotube-Based Nanoelectromechanical Switches, Beckman Institute for Advanced Science and Technology, U of I, Urbana IL, 4 pages.

(Continued)

*Primary Examiner* — Long Tran
(74) *Attorney, Agent, or Firm* — TraskBritt

(57) ABSTRACT

Semiconductor structures including a movable switching element having a base disposed on a conductive pad, a body extending from the base, and an end laterally adjacent and spaced apart from a conductive contact are disclosed. Upon application of a threshold voltage, the movable switching element may deform toward the conductive contact via an electrical field, establishing electrical contact between the conductive pad and the conductive contact. Various methods may be used to form such semiconductor structures, and switching devices including such semiconductor structures. Memory devices and electronic systems include such switching devices.

20 Claims, 10 Drawing Sheets

OTHER PUBLICATIONS

Dujardin et al., Self-Assembled Switches Based on Electroactuated Multiwalled Nanotubes, Applied Physics Letters, vol. 87, pp. 193107-1-193107-3, 2005.

Jang et al., Nanoelectromechanical Switches with Vertically Aligned Carbon Nanotubes, Applied Physics Letters, vol. 87, pp. 163114-1-163114-3, 2005.

Kaul et al., Electromechanical Carbon Nanotube Switches for High-Frequency Applications, Nano Letters, vol. 6, No. 5, pp. 942-947, 2005.

Liliental-Weber et al., InN Nanrods Grown on Different Planes of AI2O3, Microsc Microanal, vol. 13, 2007, 2 pages.

Merkulov et al., Patterned Growth of Individual and Multiple Vertically Aligned Carbon Nanofibers, Applied Physics Letters, vol. 76, No. 24, pp. 3555-3557, 2000.

Schonenberger, physicsworld.com/cws/article/print/606—43k, Multiwall Carbon Nanotubes, Physicsworld.com, Jun. 2, 2000.

Rosenblatt et al., High Performance Electrolyte Gated Carbon Nanotube Transistors, Nano Letters, vol. 2, No. 8, pp. 869-872, 2002.

Rueckes et al., Carbon Nanotube-Based Nonvolatile Random Access Memory for Molecular Computing, Science, vol. 289, No. 94, pp. 94-97, 2000.

Tans et al., Room-Temperature Transistor Based on a Single Carbon Nanotube, Letters to Nature, vol. 393, pp. 49-52, 1998.

Zheng et al., Efficient CVD Growth of Single-Walled Carbon Nanotubes on Surfaces Using Carbon Monoxide Precursor, Nano Letters, vol. 2, No. 8, pp. 895-898, 2002.

* cited by examiner

SEMICONDUCTOR STRUCTURES INCLUDING A MOVABLE SWITCHING ELEMENT AND SYSTEMS INCLUDING SAME

TECHNICAL FIELD

The invention, in various embodiments, relates generally to semiconductor structures including a movable switching element for use in memory devices such as, by way of non-limiting example, resistance memory devices and phase change memory devices, to methods of forming such semiconductor structures, to memory devices formed by such methods, and to systems including such memory devices.

BACKGROUND

Conventional cross-point memory arrays include first and second sets of transverse electrodes with memory cells formed at the crossing-points of the first and second set of electrodes. Each of the memory cells includes, in at least one of its binary states, a diode. The diode is used as a current limiting device that prevents undesired flow of current through the memory cells, minimizing programming interference, programming disturbance, and read disturbances. Incorporation of a diode within the memory cells relaxes the constraints on the memory array, and improves performance, cost structure and achievable density.

However, conventional diodes have characteristics that are poorly suited for many applications. Conventional memory elements fabricated from, for example, phase change materials, require diodes capable of tolerating high current density. A diode with a high on/off ratio of less than 1 e6 and capable of supplying a forward current of 100 A/cm$^2$ is required in a conventional cross-point memory array. Additionally, conventional cross-point memory arrays include multiple stacked materials, which require formation using low temperature (i.e., less than 400° C.) processing. Therefore, the diode must be fabricated at temperatures of less than 400° C. or, alternatively, must be separately fabricated and interconnected with the cross-point memory array after formation. Moreover, the rigid substrates on which diodes are fabricated prohibits their use in applications in which the device must be physically deformed. Contaminants from metallic contact layers frequently react with the semiconductor body during processing, and degrade the diode's electrical characteristics. Consequently, fabricating a diode that meets the required specifications presents a challenge.

Electromechanical switches are suitable for integration into cross-point memory arrays as an alternative to diodes because of their excellent on/off ratios and fast switching characteristics. An electromechanical switch provides a physical separation between the switch and the capacitor making data leakage less severe. Due to limitations of conventional fabrication techniques, such as lithographic techniques, it is difficult to scale these devices. Thus, fabricating devices on a nanoscopic scale, often referred to as "nano-scale devices," that function as ohmic contacts and have low resistance presents a challenge in semiconductor device fabrication. Conventional low resistance ohmic contacts are made of metal silicides formed on heavily doped semiconductor regions. The contact resistance is inversely proportional to contact area. In nano-scale devices, the contact area is on the order of nanometer or smaller and, thus, contact resistance limits performance.

U.S. Published Application 2003/0122640 to Deligianni et al. describes a microelectromechanical switch having a movable part, two pairs of contacts, and actuators. The movable part is laterally or pivotally deflected by the actuators to make or break connections across pairs of contacts. Precise fabrication control is required to ensure that the actuator is movable within the required range without substantially deviating from the intended range and path of travel. The actuator experiences flexion stresses, which, results in fatigue with long-term usage.

Dequesnes et al., *Applied Physics Letters,* 87, 193107-1 (2005), discloses a nanoelectromechanical switch that includes a single wall or a multiwall carbon nanotube and a fixed ground plane. Upon application of a voltage, electrostatic charges are induced on the carbon nanotube and the fixed ground plane that result in deflection of the carbon nanotube onto the ground plane. Dequesnes discloses that fixing both ends of the carbon nanotube decreases the significance of van der Waals forces between the carbon nanotube and the ground plane.

Jang et al., *Applied Physics Letters,* 87, 163114 (2005), discloses a nanoelectromechanical switching device including three multiwall carbon nanotubes (MWCNTs). Above a threshold bias, one of the MWCNTs makes contact with another of the MWCNTs establishing an "on" state. Due to electrostatic forces and van der Waals forces between the NIWCNTs, they are held together after the driving bias is removed.

In light of the state of the art, there is a need for nanoelectromechanical switching devices that may be formed at low temperatures, tolerate high current densities while providing reduced current leakage, and that eliminate the need for a negative bias, as well as methods that can be used to form such nanoelectromechanical switching devices.

BRIEF DESCRIPTION OF THE SEVERAL VIEWS OF THE DRAWINGS

FIGS. 4A-41 are partial cross-sectional side views of embodiments of a semiconductor structure and illustrate an embodiment of a method that may be used to form a switching device such as that shown in FIG. 3A.

FIGS. 5A-51 are partial cross-sectional side views of a semiconductor structure and illustrate an embodiment of a method that may be used for a switching device such as that shown in FIG. 3B.

FIG. 7 is a schematic block diagram illustrating one embodiment of an electronic system of the present invention that includes a memory device as shown in FIG. 1.

DETAILED DESCRIPTION

Figure 1:
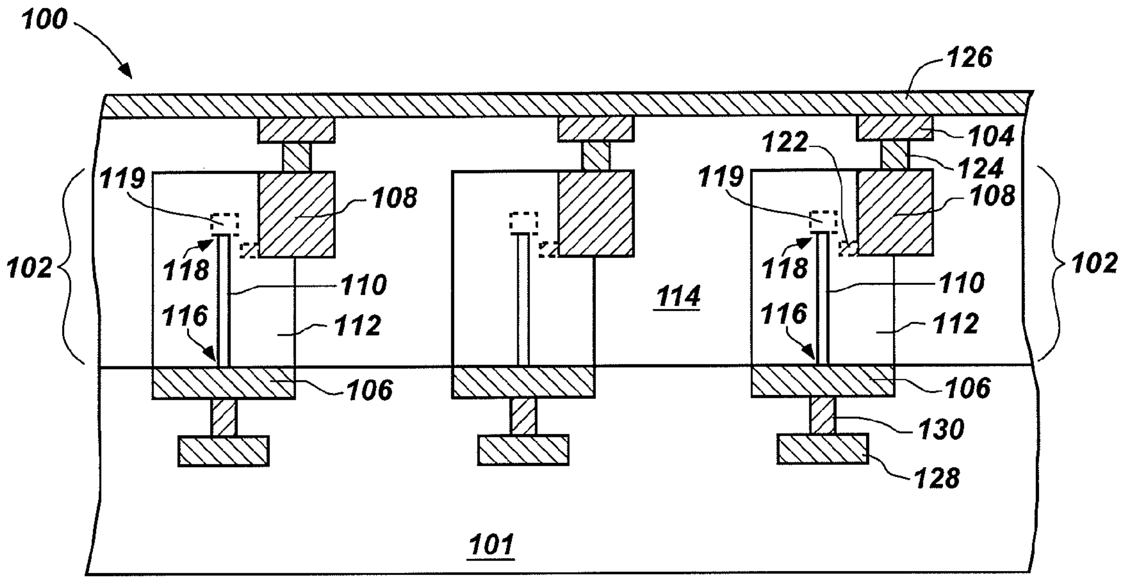
FIG. 1 is a partial cross-sectional schematic of an embodiment of a memory device of the present invention illustrating three switching devices therein.

As discussed in further detail below, in some embodiments, the present invention comprises switching devices having a switching element disposed between two electrodes. One end of the switching element is in electrical contact with at least one of the electrodes while the other end is positioned laterally adjacent to another electrode. In other embodiments, the present invention includes methods of forming such switching devices. In additional embodiments, the present invention comprises electronic systems that include one or more of such switching devices.

As used herein, the term "nanowire" means and includes any elongated structure having transverse cross-sectional dimensions averaging less than about 50 nanometers.

As used herein, the term "III-V type semiconductor material" means and includes any material predominantly comprised of one or more elements from group IIIB of the periodic table (B, Al, Ga, In, and Tl) and one or more elements from group VB of the periodic table (N, P, As, Sb, and Bi).

As used herein, the term "II-VI type semiconductor material" means and includes any material predominantly comprised of one or more elements from group IIB of the periodic table (Zn, Cd, and Hg) and one or more elements from group VIB of the periodic table (O, S, Se, Te, and Po).

As used herein, the term "substrate" means and includes any structure that includes a layer of semiconductor type material including, for example, silicon, germanium, gallium arsenide, indium phosphide, and other III-V or II-VI type semiconductor materials. Substrates include, for example, not only conventional substrates but also other bulk semiconductor substrates such as, by way of non-limiting example, silicon-on-insulator (SOI) type substrates, silicon-on-sapphire (SOS) type substrates, and epitaxial layers of silicon supported by a layer of base material. Semiconductor type materials may be doped or undoped. Furthermore, when reference is made to a "substrate" in the following description, previous process steps may have been utilized to at least partially form elements or components of a circuit or device in or over a surface of the substrate.

The term "nanotube," as used herein means and includes any hollow carbon cylinder or graphene cylinder, such as a single-walled carbon nanotube (SWNT) and a multi-walled carbon nanotube (MWNT).

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular memory device, switching device, semiconductor structure, or system, but are merely idealized representations which are employed to describe the present invention. The drawings presented herein are not necessarily drawn to scale and are not actual views of a particular semiconductor structure or fabrication process thereof, but are merely idealized representations that are employed to describe the embodiments of the invention. Additionally, elements common between drawings may retain the same numerical designation.

The following description provides specific details, such as material types, material thicknesses, and processing conditions in order to provide a thorough description of embodiments of the invention. However, a person of ordinary skill in the art will understand that the embodiments of the invention may be practiced without employing these specific details. Indeed, the embodiments of the invention may be practiced in conjunction with conventional semiconductor fabrication techniques employed in the industry. In addition, the description provided below does not form a complete process flow for manufacturing a semiconductor device in which the semiconductor structure is present, and the semiconductor devices described below do not form a complete electronic device. Only those process acts and semiconductor structures or semiconductor devices necessary to understand the embodiments of the invention are described in detail below. Additional processing acts to form a complete semiconductor device from the semiconductor structures or to form a complete electronic device from the semiconductor device may be performed by conventional fabrication techniques, which are not described herein.

The materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art. While the materials may be formed as layers, the materials are not limited thereto and may be formed in other configurations.

Reference will now be made to the figures, wherein like numerals represent like elements. The figures are not necessarily drawn to scale.

FIG. 1 is a partial cross-sectional schematic view of an embodiment of a memory device 100 of the present invention. The memory device 100 may include an integrated circuit comprising a plurality of switching devices 102, each of which is coupled to a memory cell 104. The switching devices 102 and memory cells 104 may be arranged in an array on or in a substrate 101 By way of example and not limitation, the switching devices 102 may be arranged in a plurality of rows and columns. FIG. 1 is a partial cross-sectional view taken vertically through the substrate 101 and illustrates three switching devices 102 in a common row or column of the array.

To facilitate illustration, the switching devices 102 are shown in FIG. 1 as occupying a major vertical portion of the substrate 101. It is understood, however, that in actuality, the substrate 101 may be relatively thicker than illustrated, and the switching devices 102 may occupy a relatively thinner portion of the substrate 101. Furthermore, only active elements of the switching devices 102 (i.e., the elements of the switching devices 102 through which charge carriers travel), or materials used to form such active elements, are cross-hatched to simplify the cross-sectional figures herein.

As shown in FIG. 1, each switching device 102 may comprise a conductive pad 106, a conductive contact 108, and a switching element 110 disposed within a cavity 112 in that may be formed, for example, within a dielectric material 114. By way of non-limiting example, the switching element 110 of each switching device 102 may include a nanowire or a nanorod having a first end 116 proximate to or in direct physical contact with a surface of the conductive pad 106 and a second end 118 laterally adjacent a portion of the conductive contact 108. In some embodiments, the conductive contact 108 is positioned within a range of movement of the switching element 110, which will be described in further detail below. In some embodiments, the cavity 112 may be sealed to isolate the switching element 110.

The conductive pad 106 of each switching device 102 may, for example, include a discrete, laterally isolated volume of conductive material, as shown in FIG. 1. In other embodiments, each conductive pad 106 may simply comprise an area or region of an elongated laterally extending conductive trace.

By way of example and not limitation, the switching element 110 of each switching device 102 may be a nanotube, such as a single-walled carbon nanotube (SWCNT) or a multi-walled carbon nanotube (MWCNT). In additional embodiments, each switching element 110 may be a movable structure that includes a conductive material. For example, the switching element 110 may include a substantially solid nanorod or a nanowire comprising a metal such as, for example, cobalt, copper, gold, nickel, platinum, or silver. The switching element 110 may have any suitable transverse cross-sectional shape such as, for example, a circular cross-sectional shape, a rectgular cross-sectional shape, an elliptical cross-sectional shape, or a triangular cross-sectional shape. Any type of switching element 110 may be used as long as the switching element 110 exhibits sufficient flexibility and electrical conductivity and can be formed, grown, placed, or otherwise provided within the switching devices 102, as discussed in further detail below.

With continued reference to FIG. 1, each switching element 110 may, optionally, be in physical or electrical contact with a conductive structure 119, as shown by broken lines. Each conductive structure 119 may be disposed on the second end 118 of each switching element 110, or alternatively, may be disposed between the conductive pad 106 and the first end 116 of each switching element 110. The conductive structure 119 may have an average lateral extent, such as a diameter, in a range of from about 0.5 nm to about 7 nm. In some embodiments, the conductive structures 119 may be used to catalyze the formation of the single switching elements 110 of each switching device 102, as discussed in further detail below.

In some embodiments, each switching element 110 may be grown or otherwise formed in situ at temperatures of less than 400° C., while in other embodiments, each switching element 10 may be grown or formed elsewhere and subsequently positioned within the switching device 102, as discussed in further detail below.

In some embodiments, each switching element 110 may have an average lateral extent, such as a diameter, of less than about 10 nm. More particularly, each switching element 110 may have an average lateral extent of between about 2 nm and about 6 nm in some embodiments. Even more particularly, each switching element 110 may have an average lateral extent of between about 4 nm and about 5 nm in some embodiments. The switching element 110 may have a sufficient length such that at least a portion of the switching element 110 extends laterally adjacent the conductive contact 108. By way of non-limiting example, the switching element 110 may have a length of at least twice the average diameter thereof and, more particularly, may have a length of between about 10 nm and about 100 nm.

In some embodiments, the conductive contact 108 of each switching device 102 may be substantially similar to the conductive pad 106 and may include a discrete, laterally isolated volume of conductive material. In other embodiments, each conductive contact 108 may include an area or region of an elongated laterally extending conductive trace. The conductive contact 108 may include a conductive material, such as a metal, having a work function different from a work function of the switching element 110. By utilizing materials having different work functions, the current-voltage (IV) characteristics of the switching device 102 may be tuned to be substantially asymmetrical around 0V. Optionally, the conductive contact 108 may include an extension 122 that protrudes toward the switching element 110, and may facilitate the release of the switching device 110 from the conductive contact 108, as will be described in further detail below.

In some embodiments, each switching device 102 may communicate electrically with a memory cell 104 by way of electrical contacts 124, and each memory cell 104 may communicate electrically with a conductive line 126. As a non-limiting example, each of the memory cells 104 may include a charge-based memory cell or a phase change memory cell. Each switching device 102 may also communicate electrically with another conductive line 128 by way of electrical contacts 130. In additional embodiments, the conductive pad 106 may simply comprise a region or portion of a conductive line, and the switching devices 102 need not include a separate conductive line 128 and electrical contacts 130. Similarly, in additional embodiments, the conductive contacts 108 also may comprise a region or portion of a conductive line, and the switching devices 102 need not include a separate conductive line 126 and electrical contacts 124.

Furthermore, in additional embodiments, the conductive pad 106 and the conductive contact 108 may not each electrically communicate with a conductive line, and one or both of the conductive pad 106 and the conductive contact 108 may simply communicate with a conductive pad.

Figure 2:
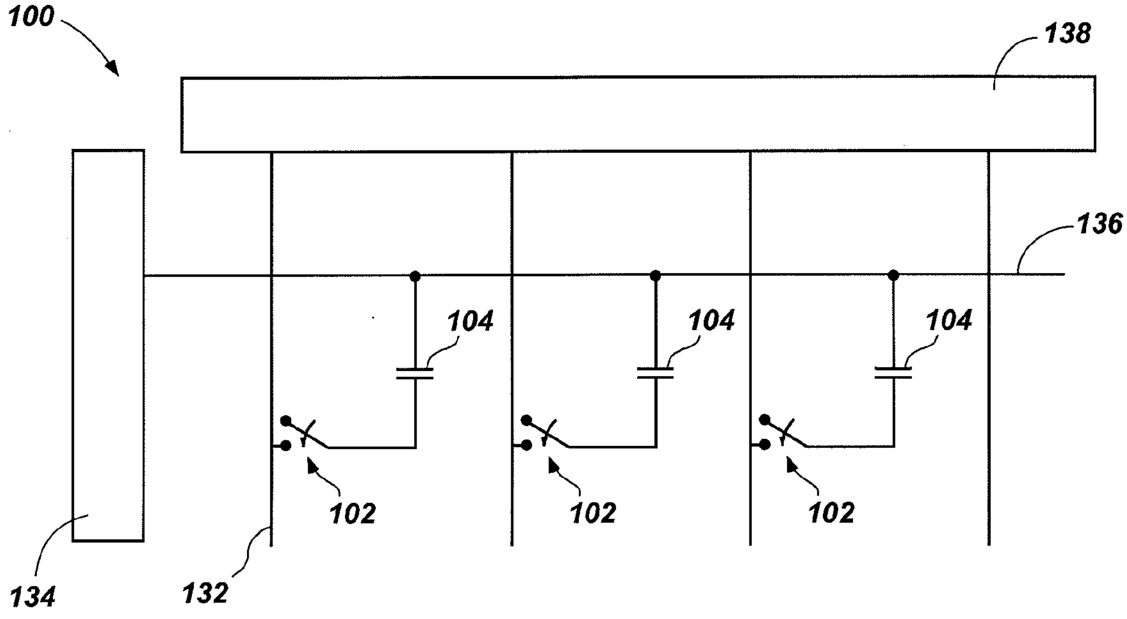
FIG. 2 is a diagram of a memory device of the present invention in which the switching devices according to the present invention are disposed in a simple matrix form.

As shown in FIG. 2, the memory device 100 may include an array of memory cells 104, each of which is coupled to a switching device 102 arranged in a simple matrix form, for selectively writing information to the memory cells 104, or selectively reading information from the memory cells 104, and various circuits, which include, for example, a first electrode 132, a first drive circuit 134 for selectively controlling the first electrode 132, a second electrode 136, a second drive circuit 138 for selectively controlling the second electrode 136, and a signal detection circuit (not shown).

The first electrodes 132 may substantially function as word lines for line selection and second electrodes 136 may substantially function as bit lines for row selection arranged orthogonally to the first electrodes 132. Specifically, the first electrodes 132 are arranged at a predetermined pitch in direction X and the second electrodes 136 are arranged at a predetermined pitch in direction Y orthogonal to direction X. In additional embodiments, the first and second electrodes 132 and 136, respectively, may be reversed so that first electrodes 132 may substantially function as bit lines while the second electrodes 136 substantially function as word lines.

Figure 3A:
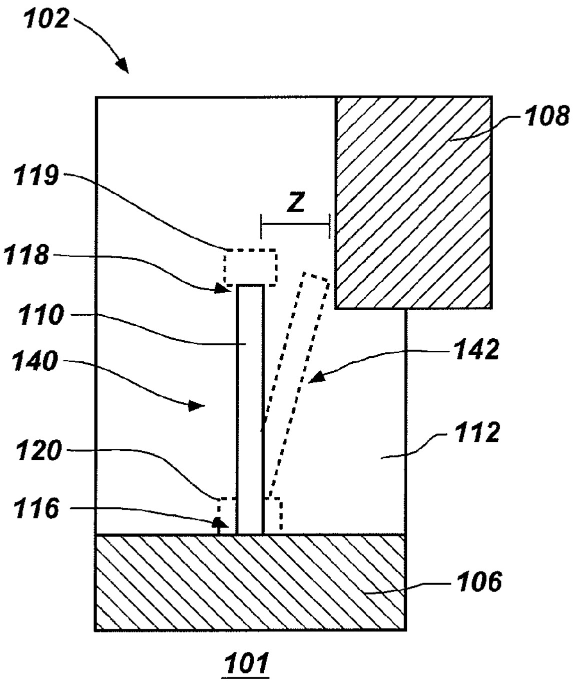
FIGS. 3A and 3B are exploded views showing one switching device as shown in FIG. 1 and are used to illustrate one manner of operation thereof.

FIG. 3A is an enlarged view of the conductive pad 106, conductive contact 108, and switching element 110 of one switching device 102 as shown in FIG. 1. As previously discussed, the switching device 110 may include, for example, a nanotube, a nanorod, or a nanowire. The switching element 110 of the switching device 102 shown in FIG. 1 may be moved between a first position 140, in which the switching element 110 is laterally adjacent a surface of the conductive contact 108, and a second position 142 (shown by broken lines), in which a portion of the switching element 110 is in electrical contact with the conductive contact 108.

In the first position 140, the switching element 110 is electrically separated from the conductive contact 108, and is in an "off" position. By way of non-limiting example, the switching element 110 in the first position 140 may be laterally spaced apart from the conductive contact 108 by a distance in a range of from about 0.5 nm to about 10 nm. The first position 140 can be read by providing a voltage between the conductive pad 106 and the conductive contact 108 and measuring the resistance at a memory cell (not shown). By way of example and not limitation, this first position 140 may be selected to represent a "0" in binary code.

To change the position of the switching element 110, a voltage may be applied to the conductive pad 106 resulting in a potential difference between the conductive pad 106 and the conductive contact 108 to induce electrostatic charges on each of the switching element 110 and the conductive contact 108. An accumulation of electrostatic charges may cause the switching element 110 to move in the direction of the conductive contact 108. Above a threshold voltage, the accumulation of electrostatic charges enables the switching element 110 to move from the first position 140 to the second position 142. As a result, the switching element 110 electrically communicates with the conductive contact 108, establishing an "on" state. The second state can be detected by again providing a relatively low voltage between the conductive pad 106 and the conductive contact 108 and measuring the magnitude (e.g., amps) of the resulting current passing therebetween, which will be different from the magnitude of the measured current when the switching element 110 is in the second position 142. By way of example and not limitation, this second position 142, may be selected to represent a "1" in binary code.

The switching device 102 may be switched between these well-defined "off" and "on" states by transiently charging the switching element 110 to produce attractive or repulsive electrostatic forces. The "on" and "off" switching thresholds required to move the switching element 110 between the first and second positions 140 and 142, respectively, may vary, depending on the specific device geometry as well as the geometry and size of the switching element 110.

The movement of the switching element 110 as the voltage is passed therethrough is due to electrostatic forces between the switching element 110 and the conductive contact 108. Additionally, van der Waals forces may act upon the switching element 110. Once the voltage is removed, the electrostatic forces dissipate and mechanical forces force the switching element 110 back to the first position 140. However, the switching element 110 remains in contact with the conductive contact 108 after removal of the voltage due to static cohesion and van der Waals forces, often referred to as "stiction" forces. A threshold force may be required to overcome the stiction forces hindering or preventing separation of the switching element 110 from the conductive contact 108. A negative bias sufficient to overcome stiction forces may be applied to overcome the threshold force needed to enable the switching element 110 to return to the first position 140, breaking the electrical contact between the switching element 110 and the conductive contact 108.

The greater the cross-sectional surface area of a contact region between the switching element 110 and the conductive contact 108, the greater the stiction forces and, thus, the energy required to separate the switching element 110 and the conductive contact 108. By reducing a cross-sectional area of the contact region between the switching element 110 and the conductive contact 108, a lower threshold force may be needed to overcome stiction forces between the switching element 110 and the conductive contact 108.

Referring still to FIG. 3A, the conductive structure 119 may be positioned at a distal portion of the second end 118 of the switching element 110 to reduce the cross-sectional area of the region of contact between the switching element 110 and the conductive contact 108. By applying a voltage sufficient to move the switching element 110 toward the conductive contact 108, a surface of the conductive structure 119 electrically contacts the conductive contact 108, providing a reduced cross-sectional area of the contact region between the switching element 110 and the conductive contact 108.

Figure 3B:
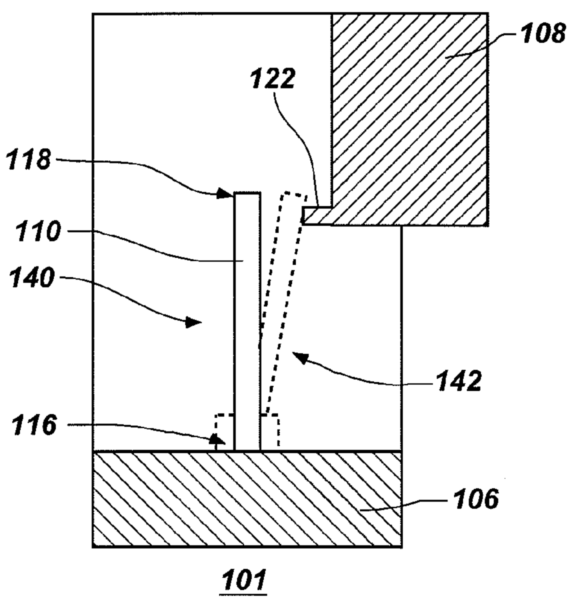

As shown in FIG. 3B, the conductive contact 108 may, optionally, include an extension 122 protruding therefrom at a position laterally adjacent the second end 118 of the switching element 110. The extension 122 may be configured to concentrate the electrical field between the conductive contact 108 and the switching element 110 in order to maximize the force present to move the switching element 110 into the second position 142. Additionally, the surface of the extension 122 opposing the switching element 110 may be configured to reduce the cross-sectional area of the contact region between the switching element 110 and the conductive contact 108 in order to reduce or eliminate stiction forces therebetween.

Figure 4A:
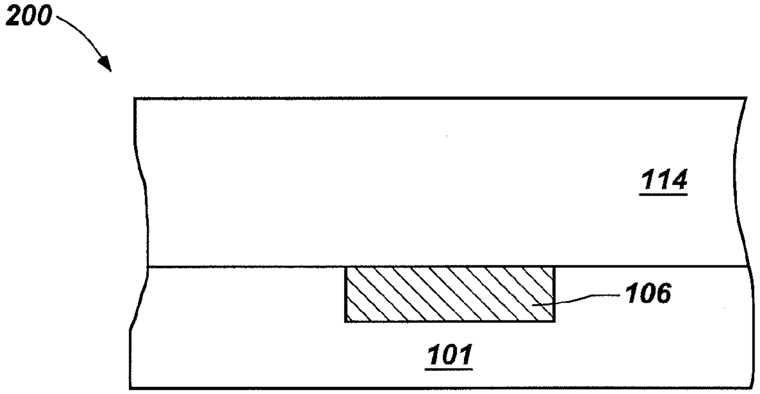

An embodiment of a method that may be used to form the switching device 102 shown in FIG. 3A is described with reference to FIGS. 4A-4I. Referring to FIG. 4A, a semiconductor structure 200 may be provided, which, includes a substrate and a conductive pad 106. The substrate 101, as previously discussed, may comprise a full or partial wafer of semiconductor material or a material such as glass or sapphire. The conductive pad 106 may be formed on or in a surface of the substrate 101 to form a semiconductor structure. The conductive pad 106 may comprise, for example, a conductive metal material such as tungsten or titanium nitride, and may be formed using, for example, metal layer deposition techniques (e.g., chemical vapor deposition (CVD), physical vapor deposition (PVD), sputtering, thermal evaporation, or plating) and patterning techniques (e.g., masking and etching) known in the art of integrated circuit fabrication. Additional features, such as, for example, conductive lines (which may simply comprise conductive pads in additional embodiments) and electrical contacts also may be formed on or in the surface of the substrate 101 in a similar manner (prior and/or subsequent to forming the conductive pads 106), although such additional features are not illustrated in FIGS. 4A-4I to simplify the figures.

Figure 4B:
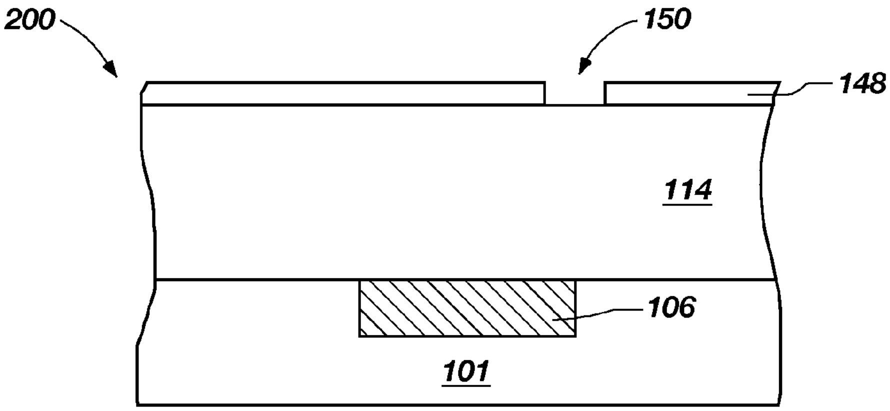

Referring to FIG. 4B, a dielectric material 114 may be provided over the semiconductor structure 200 (i.e., an exposed major surface of the substrate 101 and the conductive pad 106), and a mask 148 may be provided over the dielectric material 114. By way of example and not limitation, the dielectric material 114 may comprise an oxide such as silicon dioxide ($SiO_2$) or silicon nitride ($Si_3N_4$), and may be formed by chemical vapor deposition, by decomposing tetraethyl orthosilicate (TEOS), or by any other process known in the art of integrated circuit fabrication. The mask 148 may comprise, for example, a photoresist material or a metal material. An aperture 150 exposing a surface of the dielectric material 114 may then be formed by patterning the mask 148 at the location at which it is desired to form the conductive contact 108.

Figure 4C:
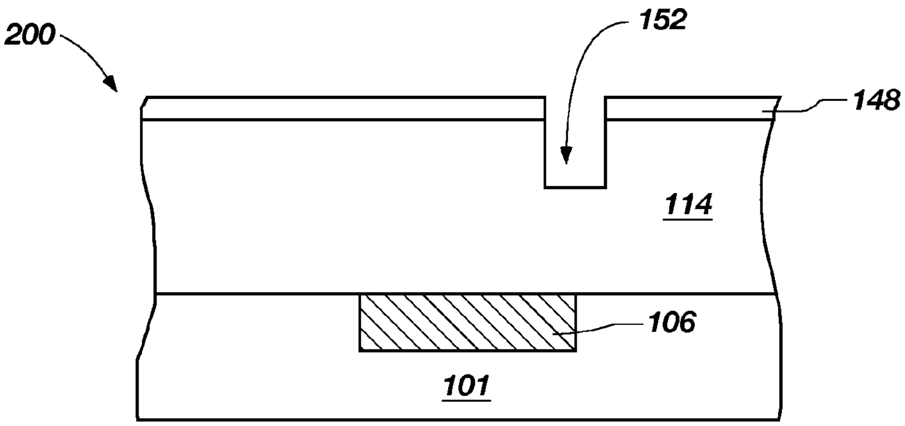

Referring to FIG. 4C, the dielectric material 114 may be removed through the aperture 150 in the mask 148 using, for example, an anisotropic reactive ion (i.e., plasma) etching process, to form a trench 152. The particular composition of the etchant used to remove the dielectric material 114 selective to the mask 148 may be selected based on the composition of the dielectric material 114 and the mask 148. As a non-limiting example, the dielectric material 114 may be silicon dioxide and a buffered hydrofluoric acid solution may be used to remove the dielectric material 114 to form the trench 152 therein.

Figure 4D:
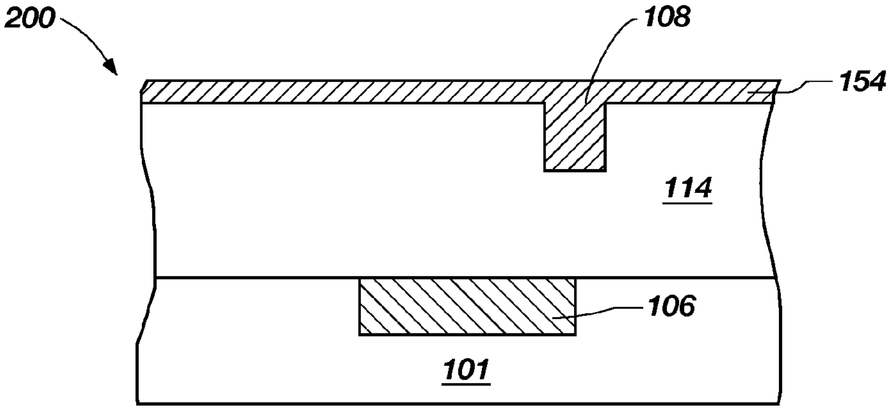

As shown in FIG. 4D, a metal material 154 may be applied to at least fill the trench 152 in the dielectric material 114 forming the conductive contact 108. As a non-limiting example, the metal material 154 may comprise a conductive metal material such as tungsten or a titanium nitride metal layer and may be formed using, for example, metal deposition techniques (e.g., chemical vapor deposition (CVD), physical vapor deposition (PVD), sputtering, thermal evaporation, or plating). By way of non-limiting example, the metal material 154 may include a material having a work function different from a work function of the switching element 110. In some embodiments, the metal material 154 is deposited over an exposed major surface of the dielectric material 114 in the process of filling the trench 152 therein, and a chemical-mechanical polishing (CMP) process may be used to planarize a surface of the metal material 154 and to expose a surface of the dielectric material 114, as shown in FIG. 4E.

Figure 4E:
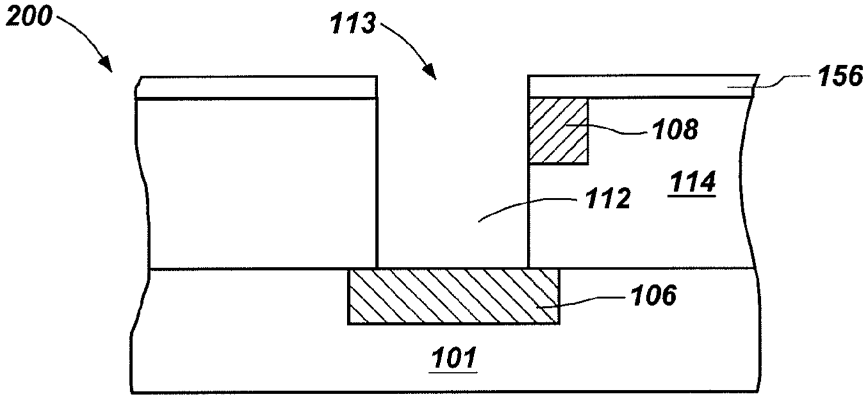

Referring to FIG. 4E, another mask 156 may be provided over the exposed surface of the dielectric material 114 and the conductive contact 108, and may include, for example, a photoresist material or metal material. The mask 156 may be selectively patterned to expose regions of the dielectric material 114 overlying the conductive pad 106, where it is desired to form the cavity 112 having an opening 113 therein. The dielectric material 114 may be removed selective to the mask 156 using, for example, an anisotropic reactive ion (i.e., plasma) etching process, to expose the underlying conductive pad 106.

Figure 4F:
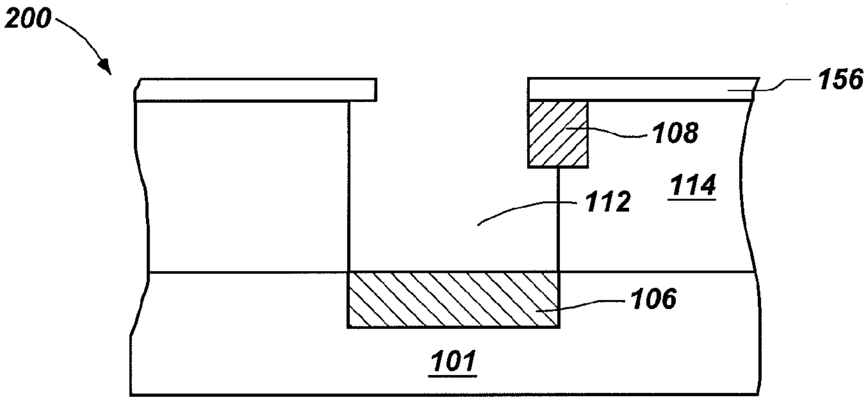

Referring to FIG. 4F, another etchant that selectively etches away the dielectric material 114 at a faster rate than the material of mask 156 that overlies the conductive contact 108 and the conductive pad 106 may be used to remove the exposed surfaces of the dielectric material 114 within the cavity 112, so as to undercut the cavity 112. By way of example and not limitation, an isotropic wet chemical etching process may be used to undercut the cavity 112. Again, the particular composition of the chemical etchant may be selected based on the composition of the dielectric material 114, the material of mask 156, the conductive contact 108, and the conductive pad 106. For example, where the dielectric material 114 includes silicon dioxide, and the conductive contact 106 and the conductive pad 108 include tungsten, a hydrofluoric acid solution may be used to undercut the cavity 112. The mask 156 may be removed using, for example, a conventional ashing process.

Figure 4G:
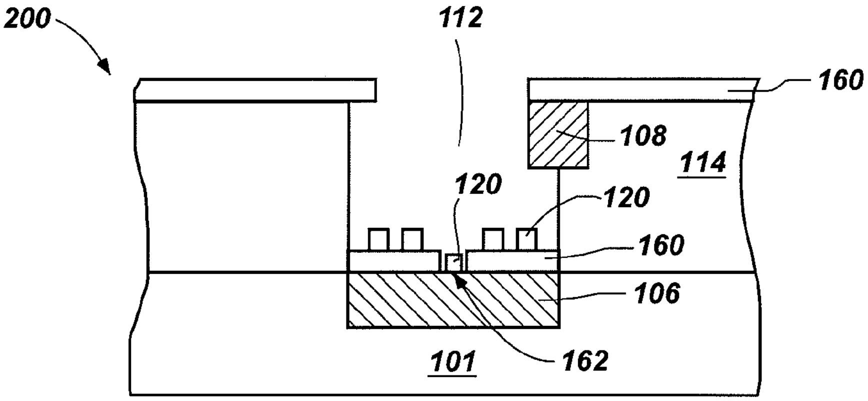
Figure 4H:
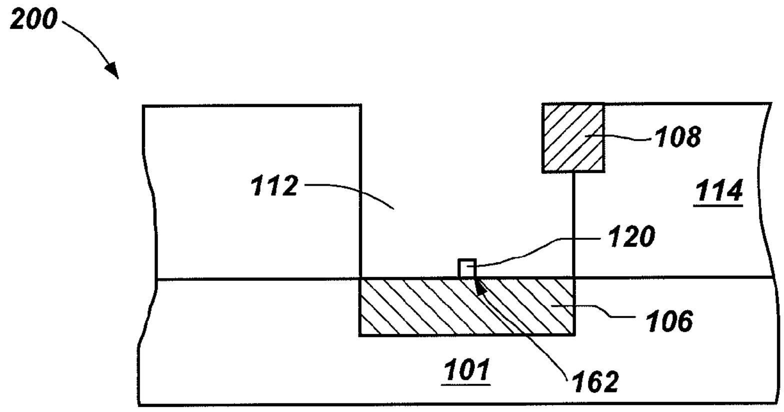

As shown in FIG. 4G, a controlled growth process may be used to form the switching element 110 on the conductive pad 106 within the cavity 112. United States Patent Application Publication No. 2005/0215049, which was published Sep. 29, 2005, and is entitled "Semiconductor Device and Method for Manufacturing the Same," the disclosure of which is incorporated herein in its entirety by this reference, describes one such process. A resist material 160 may be deposited over the exposed surfaces of the semiconductor structure 200, including the conductive pad 106 within the cavity 112, and may be patterned to expose a discrete region 162 of the conductive pad 106 at a location at which is it desired to form the switching element 110. The substrate 101 may be provided in a deposition chamber (not shown), and a general directional flow of atoms of catalytic material 120 may be generated therein using, for example, an evaporation process or a collimated sputtering process. By way of non-limiting example, a catalytic material 120 may be deposited using, for example, nickel, cobalt, iron, platinum, palladium, copper, vanadium, molybdenum, zinc, a transition metal oxide, or any combination or alloy thereof. The catalytic material 120 may be deposited on the resist material 160 and the discrete region 162, and the catalytic material 120 and the resist material 160 may be removed selective to the dielectric material 114, the conductive pad 106, and the conductive contact 108 using, for example, a selective etching process, or a lift-off process to form the structure shown in FIG. 4H. The resulting catalytic material 120 may remain on the discrete region 162 of the conductive pad 106 within the discrete region 162, as shown in FIG. 4H.

Figure 4I:
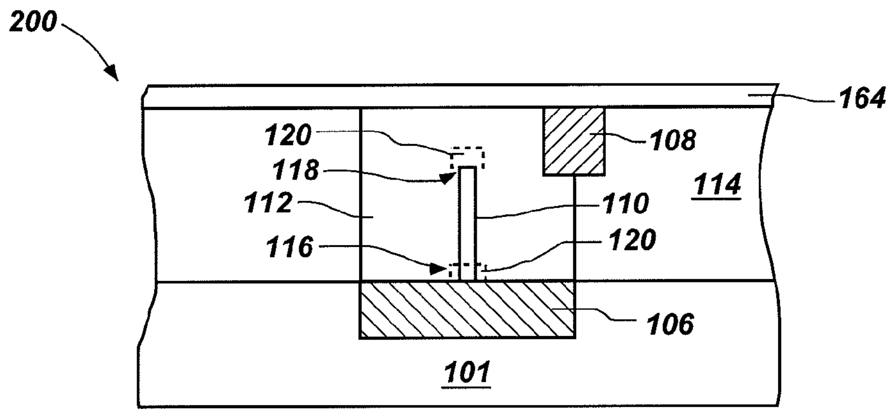

Referring to FIG. 4I, in some embodiments, the switching element 110 including a carbon nanotube may be formed in situ by a conventional technique such as, for example, a chemical vapor deposition process, an electric-arc discharge process, or a laser vaporization process. As a non-limiting example, to initiate formation of the carbon nanotube, the catalytic material 120 may be exposed to, or contacted with, a process gas at a temperature of less than 400° C. The process gas may be a gaseous precursor including a carbon-containing gas or a mixture of the carbon-containing gas and an inert gas. Non-limiting examples of carbon-containing gases include aliphatic hydrocarbons, both saturated and unsaturated, such as methane, ethane, propane, butane, hexane, ethylene, propylene and combinations thereof; carbon monoxide; oxygenated hydrocarbons, such as acetone, acetylene, methanol and combinations thereof; aromatic hydrocarbons, such as toluene, benzene, naphthalene and combinations thereof. In addition, combinations of the above-mentioned carbon-containing gases may be used. More specifically, the carbon-containing gas may be methane, carbon monoxide, acetylene, ethylene or ethanol. Inert gases, such as nitrogen, helium, hydrogen, ammonia or combinations thereof, may be used in the process gas.

Referring still to FIG. 4I, in another embodiment, the switching element 110 may be a nanowire including silicon, germanium, gallium, a III-V type semiconductor material, a II-VI type semiconductor material, a metal, and combinations or an alloy thereof. Various methods of forming and/or growing nanowires using corresponding catalyst materials are known in the art and may be used to form the switching element 110. Some of such methods are described in, for example, Younan Xia et al., "One-Dimensional Nanostructures: Synthesis, Characterization and Applications," *Advanced Materials*, Vol. 15, No. 5, pp. 353-389 (March 2003), the entire disclosure of which is incorporated herein in its entirety by this reference. By way of example and not limitation, chemical vapor deposition processes, which optionally may employ the so-called "vapor-liquid-solid" (VLS) mechanism, may be used to grow a nanowire on the catalytic material 120, as known in the art. As one non-limiting example, the catalytic material 120 may comprise gold, and the nanowire may comprise a doped silicon (Si). Such a doped silicon nanowire may be formed using a chemical vapor deposition process and the vapor-liquid-solid (VLS) mechanism, as known in the art. As another non-limiting example, the catalytic material 120 may comprise at least one of Ti, Co, Ni, Au, Ta, polysilicon, silicon-germanium, platinum, iridium, titanium nitride, or tantalum nitride, and the nanowire may comprise iridium oxide ($IrO_x$), as described in United States Patent Publication No. 2006/0086314 A1 to zhang et al., the entire disclosure of which is incorporated herein in its entirety by this reference. Furthermore, as previously discussed, the nanowire may comprise a III-V type semiconductor material or a II-V type semiconductor material. Various types of semiconductor materials that may be used to form nanowires, as well as the reactant precursor materials and catalyst materials that may be used to catalyze formation of such nanowires are disclosed in United States Patent Publication No. 2004/0028812 A1 to Wessels et al., the entire disclosure of which is also incorporated herein in its entirety by this reference.

With continued reference to FIG. 4I, the switching element 110 may be formed on the catalytic material 120 (shown in broken lines), and the catalytic material 120 may be disposed between and structurally and electrically coupled to both the switching element 110 and the conductive pad 106. Alternatively, the switching element 110 may be formed under the catalytic material 120, and the catalytic material 120 may be positioned on a distal portion of the second end 118 of the switching element 110.

Referring to FIG. 4I, after forming the switching element 110 within the cavity 112, a sealing material 164 may be applied at least over the opening 113 (shown in FIG. 4E) of the cavity 112 to seal the switching element 110 within the cavity 112. The sealing material 164 may be a flowable material such as, for example, a flowable oxide, borophosphosilicate glass (BPSG), arsenic doped glass (ASG), borosilicate glass (BSG), or phosphosilicate glass (PSG). By way of non-limiting example, the sealing material 164 may be applied by a spin-coating process, a spray-coating process, a dip-coating process or by other conventional techniques. As a non-limiting example, the sealing material 164 may be a preformed film, and may include a dielectric protective material, such as a polyimide.

Figure 5A:
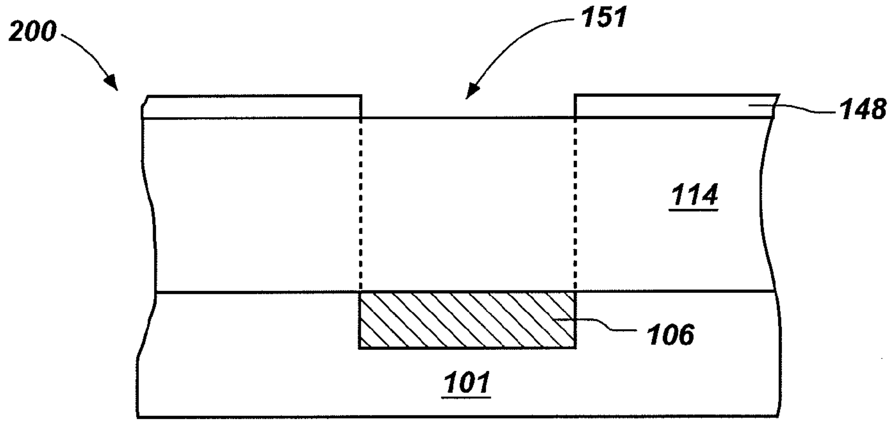

A second embodiment of a method that may be used to form an embodiment of a switching device 102 (see FIG. 1) is described below with reference to FIGS. 5A-5I. Referring to FIG. 5A, a substrate 101 may be provided that is substantially similar to the semiconductor structure shown in FIG. 4A and includes the substrate 101, conductive pad 106, a dielectric material 114, and mask 148. The mask 148 shown in FIG. 5A, however, includes an aperture 151 overlying a location in which it is desired to form the cavity 112. A portion of the dielectric material 114 may be selectively removed (as shown in broken lines) using, for example, an anisotropic etching process. As a non-limiting example, the dielectric material 114 may be an oxide material such as silicon dioxide, and may be removed selective to the mask 148 and the conductive pad 106 using a plasma including sulfur hexafluoride ($SF_6$). trifluoromethane ($CH_3$), ad helium.

Figure 5B:
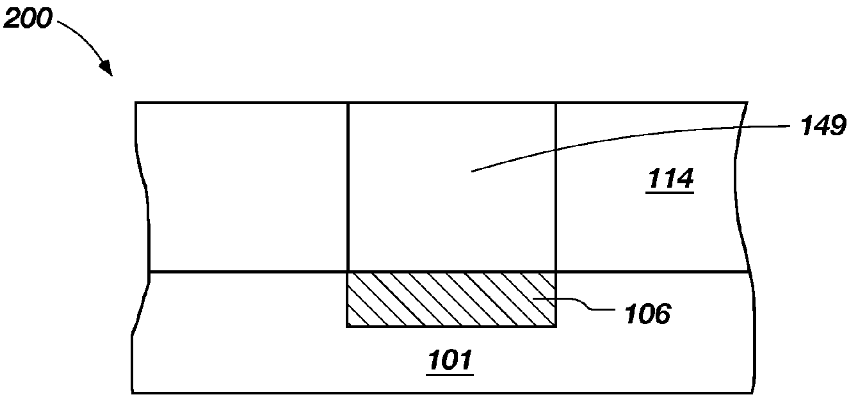

Referring to FIG. 5B, a fill material 149 may be deposited over the semiconductor structure 200. The fill material 149 may be any material that may be selectively removed with respect to the dielectric material 114 and may include, for example, a nitride material such as silicon nitride.

Figure 5C:
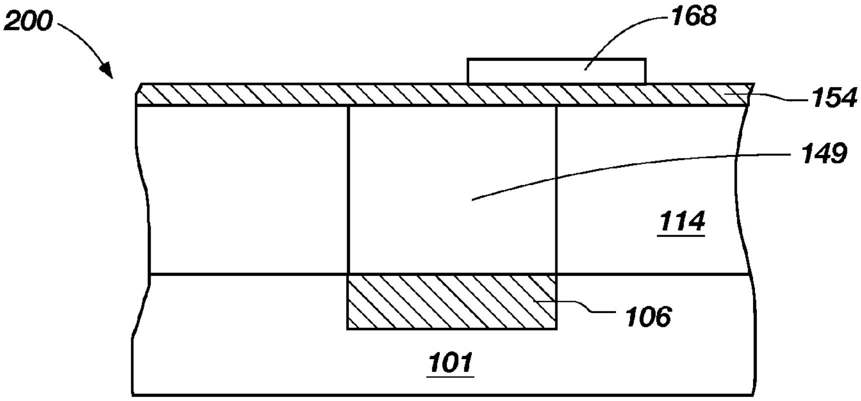
Figure 5D:
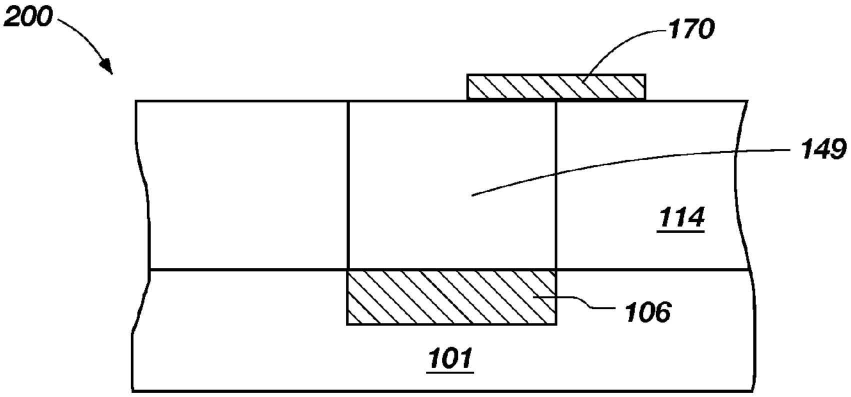

As shown in FIG. 5C, a metal material 154 may be provided over the semiconductor structure 200 (i.e., an exposed major surface of the dielectric material 114 and the fill material 149). The metal material 154 may be substantially conformal, and may include, for example, hafnium, zirconium, titanium, tantalum, aluminum, ruthenium, palladium, platinum, cobalt, nickel, combinations thereof, or an alloy thereof. The metal material 154 may be deposited using, for example, a chemical vapor deposition (CVD) process. Another mask 168 may be formed over the metal material 154 and patterned to cover a location at which it is desired to form the conductive contact 108 and removing the metal material 154 selective to the another mask 168 using, for example, an anisotropic etching process to form a metal structure 170, such as that shown in FIG. 5D.

Figure 5E:
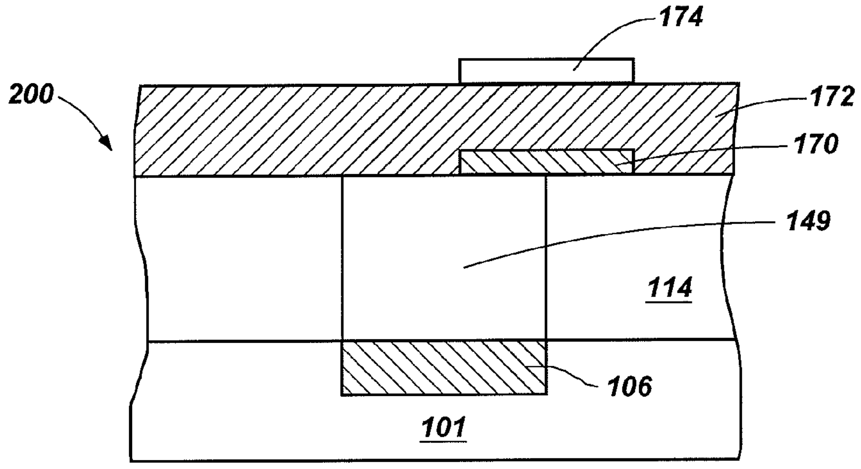

Referring to FIG. 5E, another metal 172 including a metal that may be selectively removed with respect to the metal structure 170 may be formed over the semiconductor structure 200. As a non-limiting example, the another metal 172 may be formed as a conformal layer, a portion of which may be removed, for example, using a chemical-mechanical polishing (CMP) process, to form a substantially planar surface such as that shown in FIG. 5E. A third mask material (not shown) may be formed over an exposed surface of the another metal 172, and may then be selectively patterned to form a region 174 of mask material on the surface of the another metal 172 overlying a location at which the conductive contact 108 will be formed.

Figure 5F:
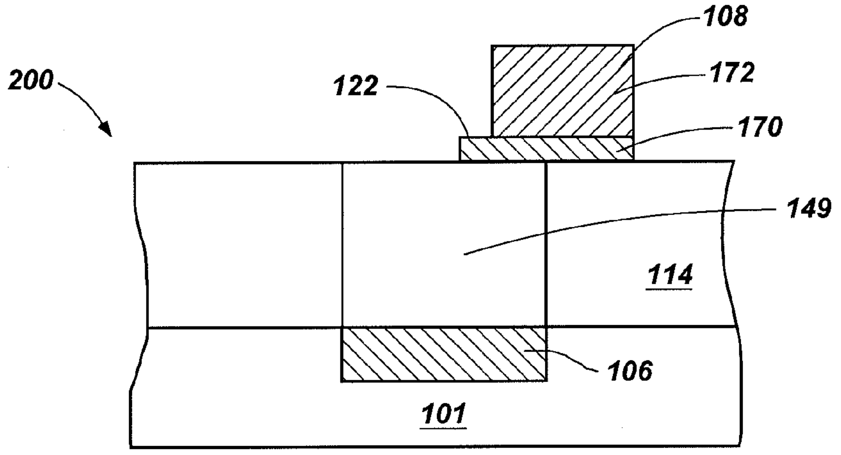

After forming the region 174 of mask material, the another metal 172 may be removed selective to the metal structure 170 and the region 174 of mask material using, for example, a selective etching process, to form the structure shown in FIG. 5F. The metal structure 170 and the remaining portion of the another metal 172 form the conductive contact 108 having the extension 122 protruding therefrom, as shown in FIG. 3B.

Figure 5G:
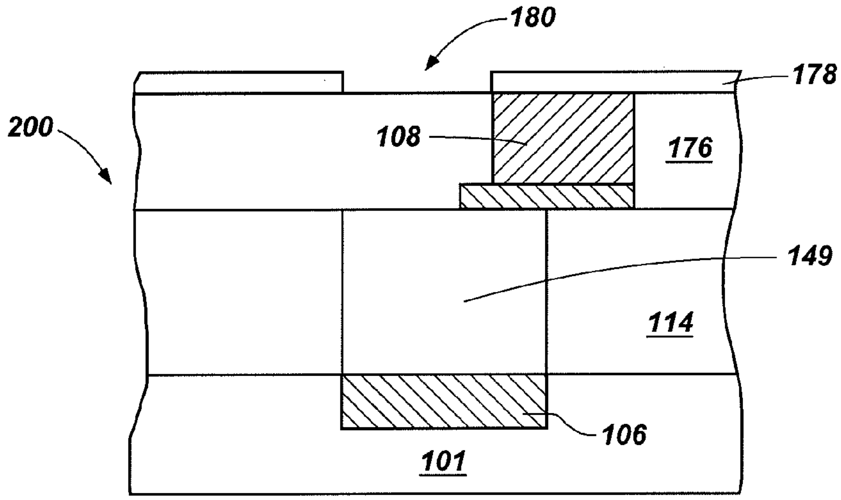

Referring to FIG. 5G, another dielectric material 176 may be provided over the semiconductor structure 200 to have a thickness greater than or equal to the distance by which the conductive contact 108 extends from the surface of the dielectric material 114 and the fill material 149. A fourth mask material 178 may be applied over the semiconductor structure 200 and may be patterned to form an aperture 180 exposing a region of the another dielectric material 176 overlying the conductive pad 106 and, optionally, the conductive contact 108.

Figure 5H:
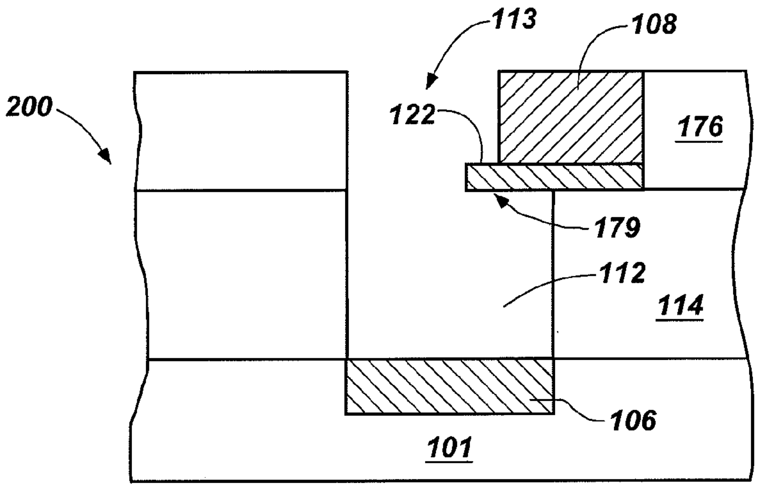

As shown in FIG. 5H, the another dielectric material 176 and the fill material 149 may be removed through the aperture 180 using, for example, an anisotropic etching process, to form the cavity 112 having the opening 113 therein. In some embodiments, a single etch chemistry may be used to selectively remove the another dielectric material 176 and the fill material 149 with respect to the dielectric material 114, the conductive pad 106, and the conductive contact 108. By way of non-limiting example, the dielectric material 114 and the another dielectric material 176 may each include silicon nitride and a plasma including a mixture of silicon hexafluoride and bromotrifluoromethane, or a mixture of ammonia and hydrogen bromide. Additionally, the another dielectric material 176 may be removed using an anisotropic etching process, while the fill material 149 may be removed using an isotropic wet etching process. By selectively removing the fill material 149 at a faster rate than the dielectric material 114 and the conductive contact 108, the cavity 112 may be undercut to expose a surface 179 of the conductive contact 108, as shown in FIG. 5H. By way of non-limiting example, the fill material 149 may include silicon nitride and the dielectric material 114 may include silicon dioxide, and the fill material 149 may be selectively removed using a mixture of phosphoric acid and water to undercut the cavity 112.

Figure 5I:
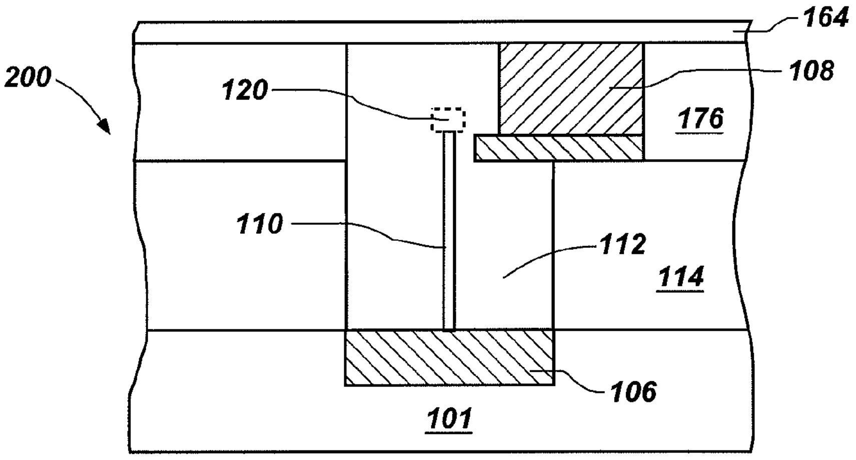

After forming the semiconductor structure 200 shown in shown in FIG. 5H, methods like those previously described in relation to FIGS. 4G-4I may be used to complete the formation of the semiconductor structure 200 including the switching element 110, as shown in FIG. 5I.

Figure 6A:
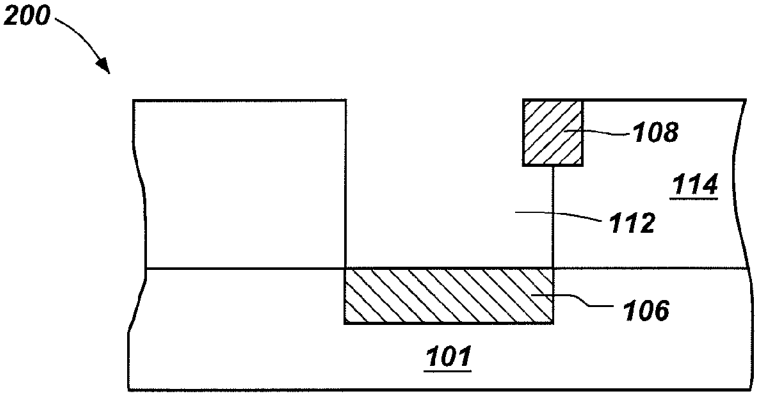
FIGS. 6A-6D are partial cross-sectional side views of a semiconductor structure and illustrate another embodiment of a method that may be used to form a switching device such as those shown in FIGS. 3A and 3B.

A third embodiment of a method that may be used to form an embodiment of a switching device 102 is described below with reference to FIGS. 6A-6D. Referring to FIG. 6A, a semiconductor structure 200 may be provided that is substantially similar to the semiconductor structure 200 shown in FIG. 4F and includes the substrate 101, conductive pad 106, a dielectric material 114, and conductive contact 108. After formation of the cavity 112 within the dielectric material 114, the mask 156 may be removed.

Figure 6B:
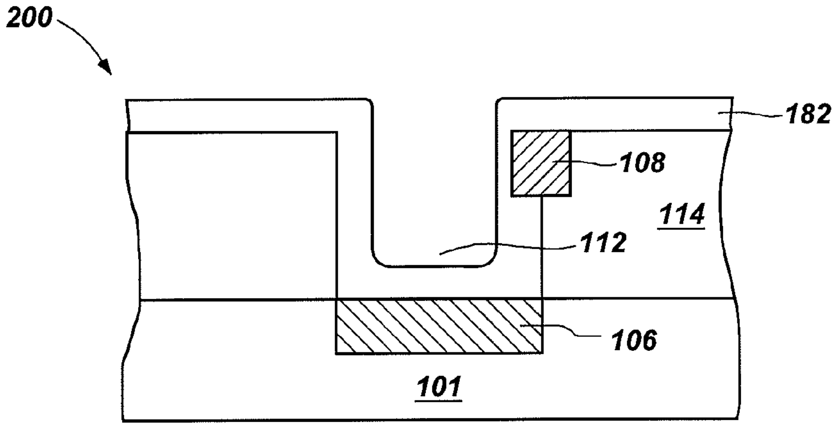

Referring to FIG. 6B, a spacer material 182 may be formed over the semiconductor structure 200 to at least partially cover the conductive pad 106, the conductive contact 108, the sidewalls of the cavity 112, and the exposed surfaces of the dielectric material 114.

Figure 6C:
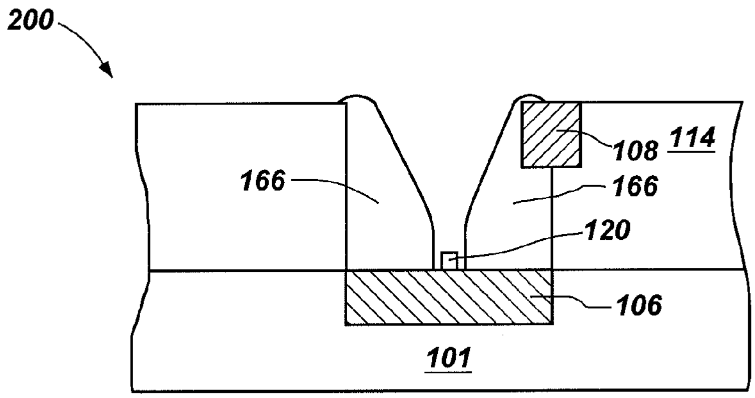

As shown in FIG. 6C, a portion of the spacer material 182 may be removed to expose a region of the conductive pad 106 which is self-aligned with the cavity 112. An etching process, such as a directional etching process, that preferentially removes the horizontal surfaces of the spacer material 182 may be used form spacers 166 on the sidewalls of the cavity 112, leaving the region of the conductive pad 106 exposed. The catalyst 120 may be deposited on the exposed region of the conductive pad 106, as described with respect to FIG. 4H.

Figure 6D:
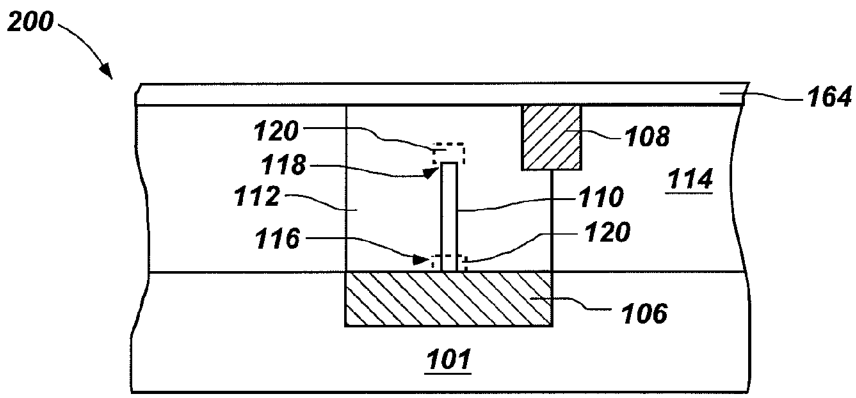

After depositing the catalytic material 120 on exposed region of the conductive pad 106 as shown in FIG. 6C, the spacers 166 may be removed and methods such as those previously described in relation to FIG. 4I may be used to complete the formation of the semiconductor structure 200 including the switching element 110, as shown in FIG. 6D.

Figure 7:
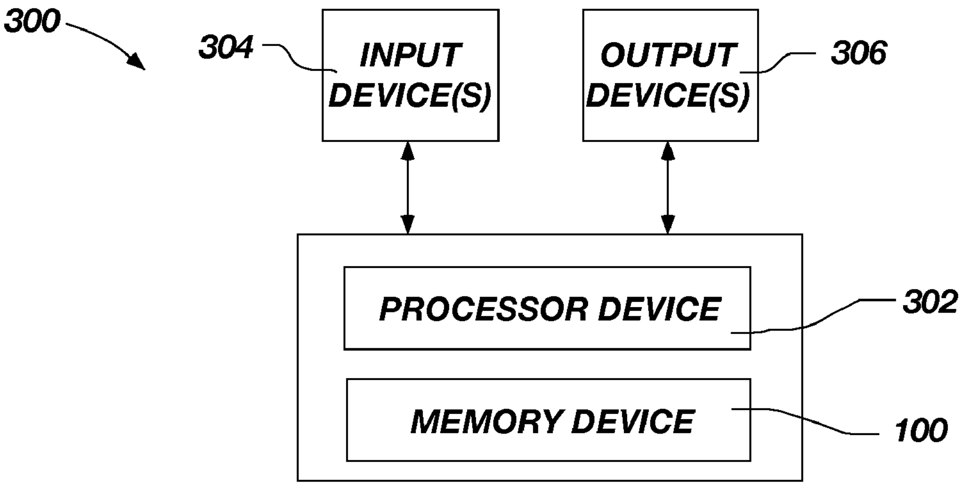

Memory devices like that shown in FIG. 1 may be used in embodiments of electronic systems of the present invention. For example, FIG. 7 is a block diagram of an illustrative electronic system 300 according to the present invention. The electronic system 300 may comprise, for example, a computer or computer hardware component, a server or other networking hardware component, a cellular telephone, a digital camera, a Personal Digital Assistant (PDA), portable medium (e.g., music) player, etc. The electronic system 300 includes at least one memory device of the present invention, such as the embodiment of the memory device 100 shown in FIG. 1. The electronic system 300 further may include at least one electronic signal processor device 302 (often referred to as a "microprocessor"). The electronic system 300 may, optionally, further include one or more input devices 304 for inputting information into the electronic system 300 by a user, such as, for example, a mouse or other pointing device, a keyboard, a touchpad, a button, or a control panel. The electronic system 300 may further include one or more output devices 306 for outputting information (e.g., visual or audio output) to a user such as, for example, a monitor, display, printer, speaker, etc. The one or more input devices 304 mad output devices 306 may communicate electrically with at least one of the memory device 100 and the electronic signal processor device 302.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention encompasses all modifications, variations and alternatives falling within the scope of the invention as defined by the following appended claims and their legal equivalents.

What is claimed is:

1. A semiconductor device comprising at least one switching device comprising:
- a first electrode;
- a second electrode; and
- a switching element having one end in contact with the first electrode and another, opposite end laterally adjacent to the second electrode, the switching element confined within a cavity in a dielectric material, the cavity exposing portions of each of the first electrode and the second electrode, at least a portion of the second electrode projecting into the cavity.

2. The semiconductor device of claim 1, wherein the cavity in the dielectric material is filled with a gas having a low dielectric constant.

3. The semiconductor device of claim 1, wherein the switching element extends from the one end disposed on a surface of the first electrode in a direction substantially perpendicular to the surface of the first electrode.

4. The semiconductor device of claim 1, wherein the switching element has a lateral extent of from about 2 nm to about 20 nm.

5. The semiconductor device of claim 1, wherein the switching element is configured to move from a first position laterally adjacent the second electrode to a second position in electrical contact with the second electrode and provide electrical communication between the first electrode and the second electrode.

6. A semiconductor structure, comprising:
- a substrate comprising at least one metal structure;
- a dielectric material overlying the substrate and having a cavity therein exposing a surface of the at least one metal structure;
- a switching element disposed on the at least one metal structure within the cavity and having a range of movement; and
- at least another metal structure, a surface of which is exposed within the cavity and is positioned laterally adjacent to and within the range of movement of the switching element.

7. The semiconductor structure of claim 6, wherein the at least one metal structure is configured to transmit a positive voltage to the switching element to induce opposite electrostatic charges on the switching element and the at least another metal structure and move the switching element in the direction of the at least another metal structure.

8. The semiconductor structure of claim 6, wherein the at least another metal structure is positioned within the range of movement of the switching element.

9. The semiconductor structure of claim 6, wherein the switching element has a lateral extent in a range of from about 2 nm to about 10 nm.

10. The semiconductor structure of claim 6, wherein the at least another metal structure includes an extension at a base thereof, the extension protruding toward the switching element.

11. The semiconductor structure of claim 10, wherein a surface of the extension opposing a surface of the switching element is configured to reduce a cross-sectional area of a contact region between the at least another metal structure and the switching element.

12. The semiconductor structure of claim 6, wherein the switching element further comprises a conductive structure disposed on an end adjacent the at least another metal structure.

13. An electronic system, comprising:
- at least one electronic signal processor;
- at least one memory device configured to communicate electrically with the at least one electronic signal processor, the at least one memory device comprising at least one switching device comprising:
  - a first electrode;
  - a switching element confined within a cavity in the at least one memory device, the switching element in electrical contact with a surface of the first electrode exposed by the cavity; and
  - a second electrode positioned within a range of movement of the switching element and having at least one exposed region protruding into the cavity; and
- at least one of an input device and an output device configured to communicate electrically with the at least one electronic signal processor.

14. The electronic system of claim 13, wherein the switching element extends from the one end disposed on a surface the first electrode in a direction substantially perpendicular to the surface of the first electrode.

15. The electronic system of claim 13, wherein the second electrode further comprises an extension protruding into the range of movement of the switching element.

16. The electronic system of claim 15, wherein the extension is configured to concentrate an electrical field formed between the second electrode and the switching element upon passing a voltage through the first electrode.

17. A semiconductor device comprising at least one switching device comprising:

a first electrode;

a second electrode; and a single carbon nanotube having one end in contact with the first electrode and another opposite end laterally adjacent to the second electrode, the single carbon nanotube confined within a cavity in a dielectric material, the cavity exposing portions of each of the first electrode and the second electrode and filled with a gas having a low dielectric constant.

18. An electronic system, comprising:

at least one electronic signal processor;

at least one memory device configured to communicate electrically with the at least one electronic signal processor, the at least one memory device comprising at least one switching device comprising:

a first electrode;

a second electrode; and a single carbon nanotube having one end in contact with the first electrode and another, opposite end laterally adjacent to the second electrode, the single carbon nanotube confined within a cavity in a dielectric material, the cavity exposing portions of each of the first electrode and the second electrode and filled with a gas having a low dielectric constant; and at least one of an input device and an output device configured to communicate electrically with the at least one electronic signal processor.

19. The semiconductor device of claim 1, wherein the switching element comprises a single carbon nanotube.

20. The electronic system of claim 13, wherein the switching element comprises a single carbon nanotube.

* * * * *

UNITED STATES PATENT AND TRADEMARK OFFICE

CERTIFICATE OF CORRECTION

PATENT NO. : 8,063,454 B2
APPLICATION NO. : 12/190985
DATED : November 22, 2011
INVENTOR(S) : Gurtej S. Sandhu et al.

It is certified that error appears in the above-identified patent and that said Letters Patent is hereby corrected as shown below:

In column 14, line 58, in Claim 14, delete “surface” and insert -- surface of --, therefor.

Signed and Sealed this
Tenth Day of January, 2012

David J. Kappos
*Director of the United States Patent and Trademark Office*